(12) United States Patent
Itai et al.

(10) Patent No.: US 7,233,105 B2
(45) Date of Patent: Jun. 19, 2007

(54) ORGANIC ELECTROLUMINESCENT DISPLAY DEVICE HAVING PLURAL CARRIER TRANSPORTATION LAYERS

(75) Inventors: Yuichiro Itai, Kawasaki (JP); Masaya Nakayama, Kawasaki (JP); Masaru Kinoshita, Kawasaki (JP); Jun Kodama, Kawasaki (JP)

(73) Assignee: Fuji Film Corporation, Tokyo (JP)

( * ) Notice: Subject to any disclaimer, the term of this patent is extended or adjusted under 35 U.S.C. 154(b) by 0 days.

(21) Appl. No.: 11/020,394

(22) Filed: Dec. 27, 2004

(65) Prior Publication Data

US 2005/0104084 A1 May 19, 2005

Related U.S. Application Data

(63) Continuation of application No. PCT/JP02/13548, filed on Dec. 25, 2002.

(51) Int. Cl.
*H01J 1/62* (2006.01)
(52) U.S. Cl. .................... 313/506; 313/504
(58) Field of Classification Search ........ 313/498–512
See application file for complete search history.

(56) References Cited

U.S. PATENT DOCUMENTS 5,343,050 A   8/1994  Egusa et al.

2003/0064246 A1*  4/2003  Kim et al. .................. 428/690

FOREIGN PATENT DOCUMENTS

| JP | 5-326146 | 12/1993 |
|----|----------|---------|
| JP | 6-95188 | 4/1994 |
| JP | 6-314594 | 11/1994 |
| JP | 7-110500 | 4/1995 |
| JP | 2000-30868 | 1/2000 |
| JP | 2001-71558 A | 3/2001 |
| JP | 2001-176667 | 6/2001 |

OTHER PUBLICATIONS

Korean Office Action dated Aug. 31, 2006, issued in corresponding Korean Patent Application No. 10-2005-7001022.

* cited by examiner

*Primary Examiner*—Joseph Williams
*Assistant Examiner*—Bumsuk Won
(74) *Attorney, Agent, or Firm*—Westerman, Hattori, Daniels & Adrian, LLP

(57) ABSTRACT

In an organic EL device disclosed, there are stacked sequentially on a glass substrate an anode, a first carrier transportation layer, a second carrier transportation layer, a light emission layer, a third carrier transportation layer, a fourth carrier transportation layer, an electron transportation layer, and a cathode. The first carrier transportation layer is formed from a material having an ionization potential Ip lower than the ionization potential Ip of the second carrier transportation layer, and the third carrier transportation layer is formed from a material having an electron affinity Ea less than the electron affinity Ea of the fourth carrier transportation layer.

10 Claims, 11 Drawing Sheets

ORGANIC EL DEVICE 10

ORGANIC EL DEVICE <u>30</u>

FIG.7

| MATERIAL | ELECTRON AFFINITY Ea(eV) | ENERGY GAP Eg(eV) | IONIZATION POTENTIAL Ip(eV) |
|---|---|---|---|
| 2-TNATA LAYER | 2.19 | 3.00 | 5.19 |
| α-NPD LAYER | 2.42 | 3.04 | 5.46 |
| TYG-201 LAYER | 3.20 | 2.40 | 5.60 |
| TYE-704 LAYER | 2.97 | 2.76 | 5.73 |

FIG.8

| | NUMBER OF STACKED LAYERS | MATERIAL | FILM THICKNESS 2ND EXAMPLE |
|---|---|---|---|
| ANODE | | ITO | 150nm |
| 1ST CARRIER TRANSPORTATION LAYER | 1ST STACKED LAYER | 2-TNATA | 50nm |
| 2ND CARRIER TRANSPORTATION LAYER | | α-NPD | 10nm |
| 1ST CARRIER TRANSPORTATION LAYER | 2ND STACKED LAYER | 2-TNATA | 10nm |
| 2ND CARRIER TRANSPORTATION LAYER | | α-NPD | 10nm |
| LIGHT EMISSION LAYER | | TYG-201 | 20nm |
| 3RD CARRIER TRANSPORTATION LAYER | 1ST STACKED LAYER | TYE-704 | |
| 4TH CARRIER TRANSPORTATION LAYER | | TYG-201 | |
| 3RD CARRIER TRANSPORTATION LAYER | 2ND STACKED LAYER | TYE-704 | |
| 4TH CARRIER TRANSPORTATION LAYER | | TYG-201 | |
| ELECTRON TRANSPORTATION LAYER | | TYE-704 | 30nm |
| CATHODE | | LiF | 0.5nm |
| | | Al | 100nm |

FIG.9

| | MATERIAL | FILM THICKNESS 2ND COMPARISON EXAMPLE | FILM THICKNESS 3RD COMPARISON EXAMPLE |
|---|---|---|---|
| ANODE | ITO | 150nm | 150nm |
| 1ST HOLE TRANSPORTATION LAYER | 2-TNATA | 20nm | 50nm |
| 1ST HOLE INJECTION LAYER | α-NPD | 10nm | 10nm |
| 2ND HOLE TRANSPORTATION LAYER | 2-TNATA | 10nm | |
| 2ND HOLE INJECTION LAYER | α-NPD | 10nm | |
| 3RD HOLE TRANSPORTATION LAYER | 2-TNATA | 10nm | |
| 3RD HOLE INJECTION LAYER | α-NPD | 30nm | |
| LIGHT EMISSION LAYER | TYG-201 | 40nm | 20nm |
| 1ST ELECTRON TRANSPORTATION LAYER | TYE-704 | | 10nm |
| 1ST ELECTRON INJECTION LAYER | TYG-201 | | 10nm |
| 2ND ELECTRON TRANSPORTATION LAYER | TYE-704 | | 10nm |
| 2ND ELECTRON INJECTION LAYER | TYG-201 | | 10nm |
| ELECTRON TRANSPORTATION LAYER | TYE-704 | 40nm | 20nm |
| | LiF | 0.5nm | 0.5nm |
| CATHODE | Al | 100nm | 100nm |

ORGANIC EL DISPLAY 50

ORGANIC ELECTROLUMINESCENT DISPLAY DEVICE HAVING PLURAL CARRIER TRANSPORTATION LAYERS

CROSS-REFERENCE TO RELATED APPLICATION

This application is a U.S. continuation application filed under 35 USC 111(a) claiming benefit under 35 USC 120 and 365(c) of PCT application JP02/13548, filed Dec. 25, 2002. The application is hereby incorporated herein by reference.

TECHNICAL FIELD

The present invention relates to an organic electroluminescent device and an organic electroluminescent display, particularly, to an organic electroluminescent device in which plural carrier transportation layers are provided between an anode and a cathode, and an organic electroluminescent display.

BACKGROUND OF THE INVENTION

An organic electroluminescent device (below, an organic electroluminescent device is referred to as "an organic EL device") is attracting attention, and study and development are being made of the organic EL device as a light emitting source of the next generation, because the organic EL device can be made small easily, has low power consumption, can be fabricated to be a surface light source, requires a much lower power voltage than that of a liquid crystal device, and hence can be used in a flat display and other various display devices.

FIG. 1 is a cross-sectional view of an organic EL device of the related art. As illustrated in FIG. 1, an organic EL device 10 of the related art includes an anode 12 formed from transparent ITO (Indium Tin Oxide), a hole transportation layer 13, a light emission layer 14, an electron transportation layer 15, and a cathode 16; these layers are stacked sequentially on a transparent glass substrate 11. The hole transportation layer 13 transports holes to the light emission layer 14 efficiently, increases spatial electron density, and increases light emission efficiency. In addition, it has been proposed to provide a layer between light emission layers to block electrons moving between the light emission layers, so as to improve the light emission efficiency of the light emission layer.

FIG. 2 is an energy diagram of the organic EL device 10 in FIG. 1. When a voltage is applied to the organic EL device 10, holes 22 move from the anode 12 to the light emission layer 14. Due to movement of the holes 22, an electric current of the holes 22 is generated, and due to movement of electrons 21, an electric current of the electrons 21 is generated. When the electrons 21 and the holes 22 arrive at the light emission layer 14, the electrons 21 and the holes 22 re-combine, and release energy. Due to the released energy, organic fluorescent materials in the light emission layer 14 are excited and emit light.

Efficiency of light emission is expressed by light emission luminance. Hence, the efficiency of the light emission of the light emission layer 14 is determined by the magnitudes of the hole current and the electron current, which flow through the organic EL device 10, and when either of the currents is large, the light emission efficiency of the light emission layer 14 declines. The magnitudes of the hole current and the electron current depend on types of the films constituting the organic EL device and film thicknesses of the stacked films. For example, if the magnitude of the hole current is unduly larger than the electron current, there arises a problem in that an increasing portion of the hole current is consumed but does not contribute to light emission, and this results in reduction of the light emission efficiency of the light emission layer 14, and an increase of power consumption.

DISCLOSURE OF THE INVENTION

Accordingly, it is a general object of the present invention to solve the above problems by providing an organic electroluminescent device able to control the magnitude of a hole current and the magnitude of an electron current flowing through a light emission layer, thus enabling efficient re-combination of the holes and the electrons, and hence being superior in light emission efficiency; and an organic electroluminescent display.

A specific object of the present invention is to provide an organic electroluminescent device, comprising: a light emission layer formed between an anode and a cathode that face each other; a first carrier transportation layer formed on a side of the light emission layer facing the anode; a second carrier transportation layer formed on a side of the first carrier transportation layer facing the cathode and in contact with the first carrier transportation layer, and one or more stacked layers formed alternately by the first carrier transportation layer and the second carrier transportation layer, wherein an ionization potential $Ip_{P1}$ of the first carrier transportation layer and an ionization potential $Ip_{P2}$ of the second carrier transportation layer satisfy $Ip_{P1} < Ip_{P2}$.

Here, the ionization potential is a difference between the valence electron level of the light emission layer or the carrier transportation layer and the energy of the vacuum level, and it has a positive value.

According to the present invention, a first carrier transportation layer is formed on a side of the light emission layer facing the anode, and a second carrier transportation layer, which has an ionization potential $Ip_{P2}$ greater than an ionization potential $Ip_{P1}$ of the first carrier transportation layer, is formed on a side of the first carrier transportation layer facing the cathode. Thereby, an energy barrier is built on the interface of the first carrier transportation layer and the second carrier transportation layer, which are in the middle of the path of holes moving from the anode toward the light emission layer. Thus, the holes are stored in the first carrier transportation layer, and the magnitude of the hole current flowing through the light emission layer decreases. As a result, the magnitude of the current of the holes is adjusted, and this increases the light emission efficiency.

Another specific object of the present invention is to provide an organic electroluminescent device, in which an energy gap $Eg_{EML}$ of the light emission layer and an energy gap $Eg_{P2}$ of the second carrier transportation layer satisfy $Eg_{EML} < Eg_{P2}$.

Here, the energy gap Eg is the difference between the conduction level and the energy of the valence electron level (the energy of the upper edge of the valence electron band), and it has a positive value.

According to the present invention, by providing the second carrier transportation layer, which has an energy gap $Eg_{P2}$ greater than the energy gap $Eg_{EML}$ of the light emission layer, on a side of the light emission layer facing the anode, recombination of holes and electrons in the second carrier transportation layer is suppressed, and this increases the light emission efficiency of the light emission layer.

Another specific object of the present invention is to provide an organic electroluminescent device, comprising a light emission layer formed between an anode and a cathode that face each other; a first carrier transportation layer formed on a side of the light emission layer facing the anode; a second carrier transportation layer formed on a side of the first carrier transportation layer facing the cathode and in contact with the first carrier transportation layer; one or more stacked layers formed alternately by the first carrier transportation layer and the second carrier transportation layer; a third carrier transportation layer formed on a side of the light emission layer facing the cathode; a fourth carrier transportation layer formed on a side of the third carrier transportation layer facing the cathode and in contact with the third carrier transportation layer; and one or more stacked layers formed alternately by the third carrier transportation layer and the fourth carrier transportation layer, wherein an ionization potential $Ip_{P1}$ of the first carrier transportation layer and an ionization potential $Ip_{P2}$ of the second carrier transportation layer satisfy $Ip_{P1} < Ip_{P2}$, and an electron affinity $Ea_{P3}$ of the third carrier transportation layer and an electron affinity $Ea_{P4}$ of the fourth carrier transportation layer satisfy $Ea_{P3} < Ea_{P4}$.

Here, the electron affinity is the difference between a conduction level of the light emission layer or the carrier transportation layer (the energy of the lower edge of the conduction band) and the energy of the vacuum level, and it has a positive value.

According to the present invention, a second carrier transportation layer, which has an ionization potential $Ip_{P2}$ greater than an ionization potential $Ip_{P1}$ of the first carrier transportation layer, is formed on a side of the first carrier transportation layer facing the cathode and in contact with the first carrier transportation layer. Thereby, an energy barrier is built on the interface of the first carrier transportation layer and the second carrier transportation layer, which are in the middle of the path of holes moving from the anode toward the light emission layer. In addition, because a fourth carrier transportation layer, which has an electron affinity $Ea_{P4}$ greater than an electron affinity $Ea_{P3}$ of the third carrier transportation layer, is formed on a side of the third carrier transportation layer facing the cathode and in contact with the third carrier transportation layer, an energy barrier is built on the interface of the fourth carrier transportation layer and the third carrier transportation layer, which are in the middle of the path of electrons moving from the cathode toward the light emission layer. As a result, magnitudes of the hole current and the electron current are adjusted, and this increases the light emission efficiency.

Another specific object of the present invention is to provide an organic electroluminescent device, in which an energy gap $Eg_{EML}$ of the light emission layer, an energy gap $Eg_{P2}$ of the second carrier transportation layer, and an energy gap $Eg_{P3}$ of the third carrier transportation layer satisfy $Eg_{EML} < Eg_{P2}$, and $Eg_{EML} < Eg_{P3}$.

According to the present invention, a second carrier transportation layer, which has an energy gap $Eg_{P2}$ greater than an energy gap $Eg_{EML}$ of the light emission layer, is formed on a side of the light emission layer facing the anode, and a third carrier transportation layer, which has an energy gap $Eg_{P3}$ greater than the energy gap $Eg_{EML}$ of the light emission layer, is formed on a side of the light emission layer facing the anode, recombination of holes and electrons in the second carrier transportation layer and the third carrier transportation layer is suppressed, and this increases the light emission efficiency of the light emission layer.

Another specific object of the present invention is to provide an organic electroluminescent display comprising an organic electroluminescent device, said organic electroluminescent device including a light emission layer formed between an anode and a cathode that face each other; a first carrier transportation layer formed on a side of the light emission layer facing the anode; a second carrier transportation layer formed on a side of the first carrier transportation layer facing the cathode and in contact with the first carrier transportation layer; and one or more stacked layers formed alternately by the first carrier transportation layer and the second carrier transportation layer, wherein an ionization potential $Ip_{P1}$ of the first carrier transportation layer and an ionization potential $Ip_{P2}$ of the second carrier transportation layer satisfy $Ip_{P1} < Ip_{P2}$.

According to the present invention, a first carrier transportation layer is formed on a side of the light emission layer facing the anode, and a second carrier transportation layer, which has an ionization potential $Ip_{P2}$ greater than an ionization potential $Ip_{P1}$ of the first carrier transportation layer, is formed on a side of the first carrier transportation layer facing the cathode. Thereby, an energy barrier is built on the interface of the first carrier transportation layer and the second carrier transportation layer, which are in the middle of the path of holes moving from the anode toward the light emission layer. Thus, the holes are stored in the first carrier transportation layer, and the magnitude of the hole current flowing through the light emission layer decreases. As a result, the magnitude of the current of the holes is adjusted, and this increases the light emission efficiency. By forming an organic electroluminescent display having such an organic electroluminescent device, it is possible to improve visibility and reduce power consumption of the organic electroluminescent display.

BRIEF DESCRIPTION OF THE DRAWINGS

FIG. 7 is a table summarizing an electron affinity Ea, an ionization potential Ip, and an energy gap Eg of layers shown in the first example of the present embodiment;

FIG. 8 is a table for explaining a layer structure of an organic EL device as the second example of the present embodiment;

FIG. 9 is a table for explaining a layer structure of the organic EL devices as the second and third examples for comparison;

BEST MODE FOR CARRYING OUT THE INVENTION

Below, embodiments of the present invention are explained with reference to the accompanying drawings.

First Embodiment

Figure 1:
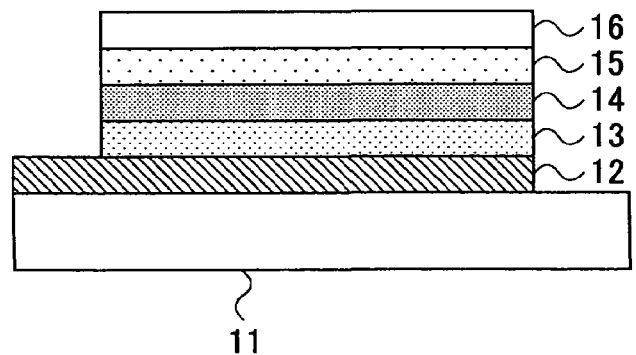
FIG. 1 is a cross-sectional view of an organic EL device of the related art.
Figure 2:
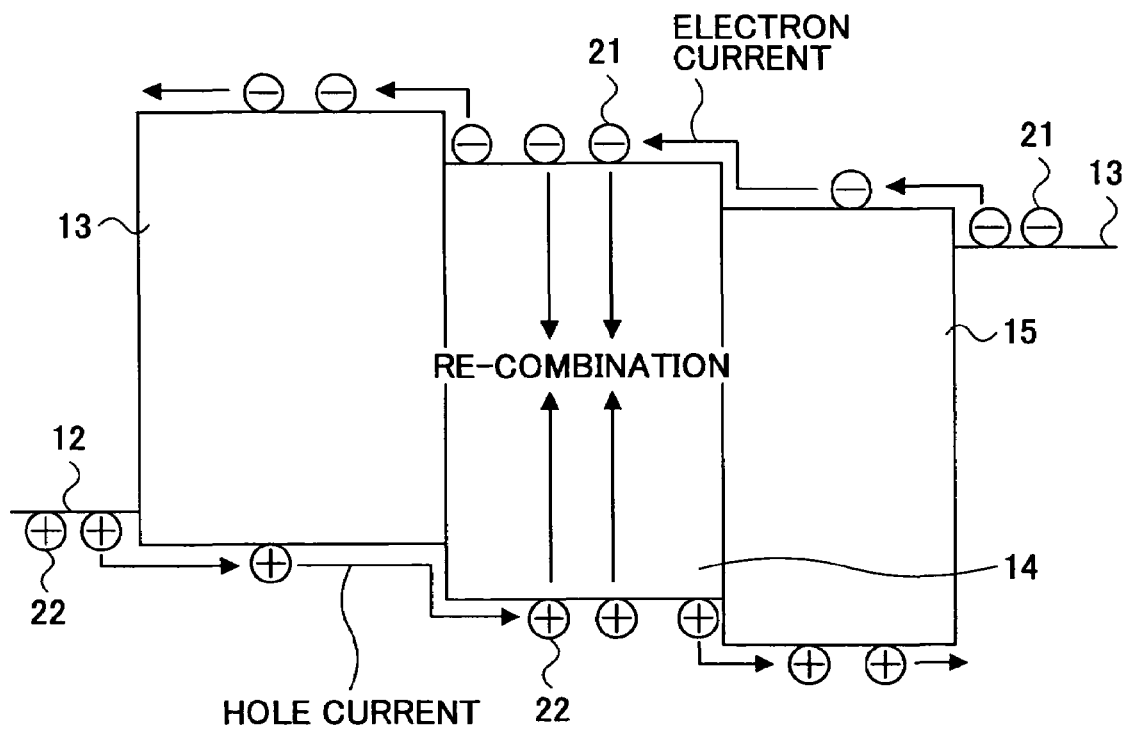
FIG. 2 is an energy diagram of the organic EL device in FIG. 1.
Figure 3:
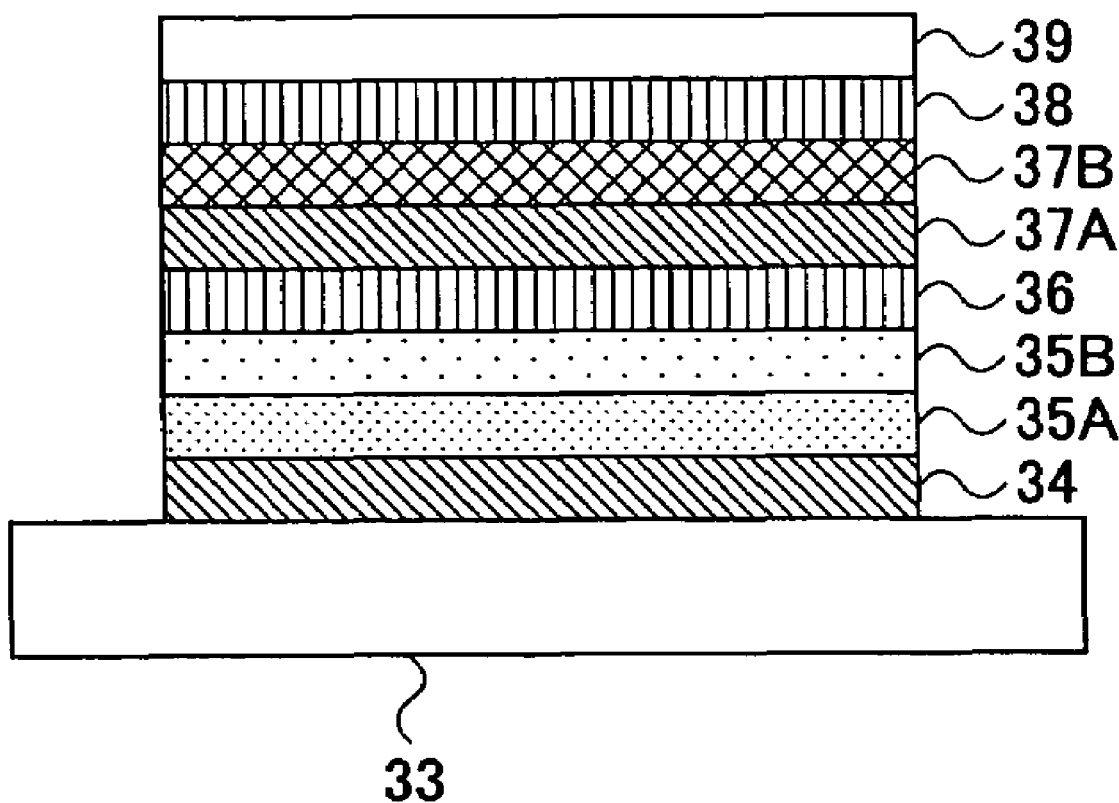
FIG. 3 is a cross-sectional view of an organic EL device according to a first embodiment of the present invention.

FIG. 3 is a cross-sectional view of an organic EL device according to a first embodiment of the present invention. As illustrated in FIG. 3, an organic EL device 30 includes an anode 34, a first carrier transportation layer 35A, a second carrier transportation layer 35B, a light emission layer 36, a third carrier transportation layer 37A, a fourth carrier transportation layer 37B, an electron transportation layer 38, and a cathode 39, and these layers are stacked sequentially on a glass substrate 33. The first carrier transportation layer 35A is formed from a material having the ionization potential $Ip_{P1}$ lower than the ionization potential $Ip_{P2}$ of the second carrier transportation layer 35B, and the third carrier transportation layer 37A is formed from a material having the electron affinity $Ea_{P3}$ less than the electron affinity $Ea_{P4}$ of the fourth carrier transportation layer 37B.

The film thickness of the organic EL device 30 is from 10 nm to 1000 nm. If the film thickness of the organic EL device 30 is greater than 1000 nm, the resistance increases and this impedes current conduction. If the film thickness of the organic EL device 30 is less than 10 nm, the light emission layer 36 becomes too thin, and this results in insufficient light emission luminance.

The anode 34 and the cathode 39 are used for applying appropriate voltages to the organic EL device 30. For example, the anode 34 is formed from ITO or IZO (Indium Zinc Oxide) and the like, and the cathode 39 is formed from an Al/LiF electrode or Ag/Mg electrode or the like.

The first carrier transportation layer 35A and the second carrier transportation layer 35B are respectively formed from materials having high electron and hole transportation capabilities. The first carrier transportation layer 35A may be formed from 2-TNATA (produced by Toyo Ink Co.), represented by the following chemical formula (1). The second carrier transportation layer 35B may be formed from ANPD (produced by Toyo Ink Co.), represented by the following chemical formula (2), or EL002 (produced by Hodogaya Chemistry Co.), or the like.

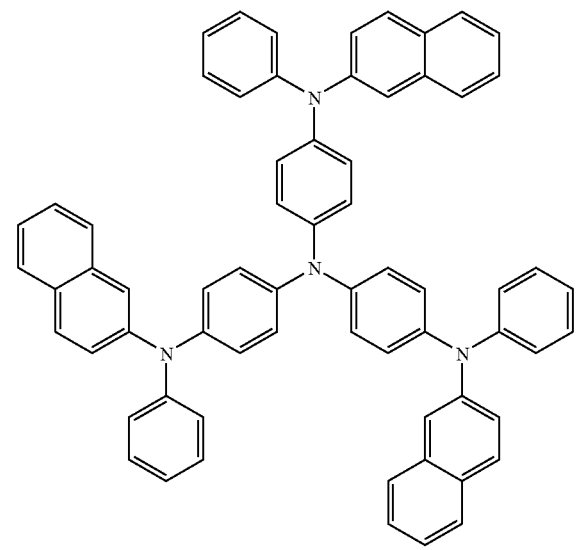

(1)

4,4',4"-tris(2-naphthylphenylamino)triphenylamine (2-TNATA)

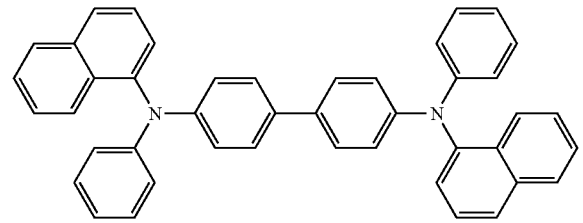

(2)

N,N'-di(1-naphthyl)-N,N'-diphenyl-[1,1'-biphenyl]-4,4'-diamine (αNPD)

The film thicknesses of the first carrier transportation layer 35A and the second carrier transportation layer 35B are set to be in a range from 10 nm to 50 nm, which can be appropriately selected according to the number of layers included in the organic EL device 30 and the total thickness of the organic EL device 30.

The third carrier transportation layer 37A and the fourth carrier transportation layer 37B are respectively formed from materials having high electron and hole transportation capabilities. The third carrier transportation layer 37A may be formed from TYE-704 (produced by Toyo Ink Co.). The fourth carrier transportation layer 37B may be formed from TYG-201 (produced by Toyo Ink Co.), or CBP (produced by Dojindo Chemistry Institute), or the like. The film thicknesses of the third carrier transportation layer 37A and the fourth carrier transportation layer 37B are set to be in a range from 10 nm to 50 nm, which can be appropriately selected according to the number of layers included in the organic EL device 30 and the total thickness of the organic EL device 30.

The light emission layer 36 includes materials which emit light of desired colors, for example, organic fluorescent materials, and may be formed from a metal complex, such as TYG-201 (produced by Toyo Ink Co.), or may be formed from $Alq_3$ (tris (8-hydroxyquinolio) aluminum) (produced by Toyo Ink Co.), represented by the following chemical formula (3). The film thickness of the light emission layer 36 is set to be in a range from 10 nm to 50 nm, which can be appropriately selected in the same way as the aforesaid carrier transportation layers.

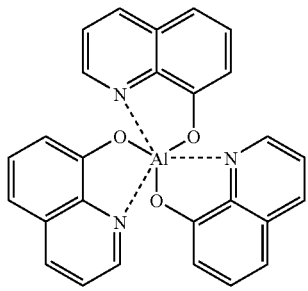

(3)

(tris (8-hydroxyquinolio) aluminum) ($Alq_3$)

The electron transportation layer 38 is formed from materials having high electron transportation capability, and for example, the electron transportation layer 38 may be formed from TYE-704 (produced by Toyo Ink Co.) or TYE-703 (produced by Toyo Ink Co.).

For example, the above layers of the organic EL device 30 are formed by vacuum evaporation with the pressure to be $1.33 \times 10^{-4}$ Pa, and the temperature of the glass substrate 33 to be the room temperature.

Figure 4:
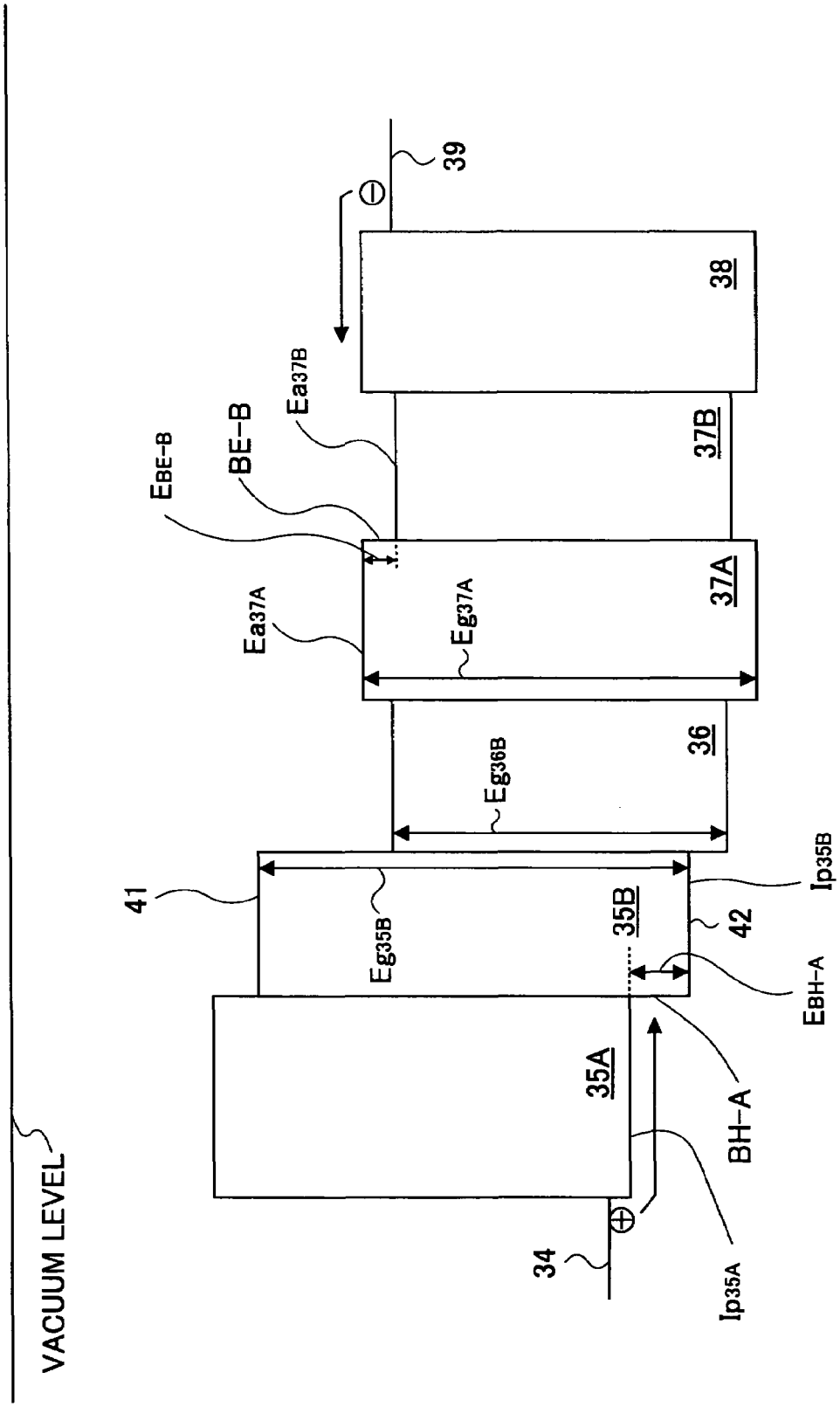
FIG. 4 is an energy diagram of the organic EL device according to the first embodiment of the present invention.

FIG. 4 is an energy diagram of the organic EL device 30 according to the first embodiment of the present invention. In FIG. 4, Ea, Eg, and Ip respectively represent the electron affinity Ea, the energy gap Eg, and the ionization potential Ip of each of the layers of the organic EL device 30. The electron affinity Ea is the difference between a conduction level 41 (the energy of the lower edge of the conduction band) and the energy of the vacuum level, the energy gap Eg is the difference between the conduction level 41 and the energy of the valence electron level 42 (the energy of the upper edge of the valence electron band), and the ionization potential Ip is the difference between the valence electron level 42 and the energy of the vacuum level.

As illustrated in FIG. 4, on the side of light emission layer 36 facing the anode 34, the second carrier transportation layer 35B is formed, and on the side of the second carrier transportation layer 35B facing the anode 34, the first carrier transportation layer 35A is formed. Further, on the side of light emission layer 36 facing the cathode 39, the third carrier transportation layer 37A is formed, and on the side of the third carrier transportation layer 37A facing the cathode 39, the fourth carrier transportation layer 37B is formed.

Assuming that the ionization potential of the first carrier transportation layer 35A and the ionization potential of the second carrier transportation layer 35B are represented by $Ip_{35A}$ and $Ip_{35B}$, respectively, it is set that the relation between the first carrier transportation layer 35A and the second carrier transportation layer 35B satisfies $Ip_{35A} < Ip_{35B}$.

In addition, assuming that the electron affinity of the third carrier transportation layer 37A and the electron affinity of the fourth carrier transportation layer 37B are represented by $Ea_{37A}$ and $Ea_{37B}$, respectively, it is set that the relation between the third carrier transportation layer 37A and the fourth carrier transportation layer 37B satisfies $Ea_{37A} < Ea_{37B}$.

Further, assuming that energy gaps of the light emission layer 36, the second carrier transportation layer 35B, and the third carrier transportation layer 37A are represented by $Eg_{36}$, $Eg_{35B}$, and $Eg_{37A}$, respectively, it is set that the relations between the light emission layer 36, the second carrier transportation layer 35B, and the third carrier transportation layer 37A satisfy $Eg_{36} < Eg_{35B}$, and $Eg_{36} < Eg_{37A}$.

The current of the holes is explained below. The holes moves from the anode 34 toward the cathode 39 through the first carrier transportation layer 35A and the second carrier transportation layer 35B, and arrive at the light emission layer 36. On the interface of the first carrier transportation layer 35A and the second carrier transportation layer 35B, an energy barrier BH-A is built. The height $E_{BH-A}$ of the energy barrier BH-A equals the difference between the ionization potential $Ip_{35A}$ of the first carrier transportation layer 35A and the ionization potential $Ip_{35B}$ of the second carrier transportation layer 35B, that is, $E_{BH-A} = Ip_{35B} - Ip_{35A}$. Because it is set that $Ip_{35A} < Ip_{35B}$, it is obtained that $E_{BH-A} > 0$. Thus, the holes are stored in the first carrier transportation layer 35A because of the energy barrier BH-A, and the magnitude of the hole current decreases. As a result, the magnitude of the hole current flowing through the light emission layer 36 is adjusted, and the electrons and the holes are re-combined after the adjustment. This increases the efficiency of light emission.

Because the energy gap $Eg_{35B}$ of the second carrier transportation layer 35B is greater than the energy gap $Eg_{36}$ of the light emission layer 36, recombination in the second carrier transportation layer 35B is prevented, and this increases the efficiency of light emission in the light emission layer 36.

Current of the electrons is explained below. The electrons move from the cathode 39 toward the anode 34 through the electron transportation layer 38, the fourth carrier transportation layer 37B, and the third carrier transportation layer 37A, and arrive at the light emission layer 36. On the interface of the third carrier transportation layer 37A and the fourth carrier transportation layer 37B, an energy barrier BE-B is formed. The height $E_{BE-B}$ of the energy barrier BE-A equals the difference between the electron affinity $Ea_{37B}$ of the fourth carrier transportation layer 37B and the electron affinity $Ea_{37A}$ of the third carrier transportation layer 37A, that is, $E_{BE-B} = Ea_{37B} - Ea_{37A}$. Because it is set that $Ea_{37A} < Ea_{37B}$, it is obtained that $E_{BE-B} > 0$. Thus, the electrons are stored in the fourth carrier transportation layer 37B, and the magnitude of the electron current decreases. Thereby, the magnitude of the electron current flowing through the light emission layer 36 can be adjusted. As a result, plural energy barriers BH-A related to the holes are formed, and by providing the energy barrier BE-B related to the electrons, the magnitudes of the hole current and the electron current can be adjusted, and this increases the efficiency of light emission.

Because the energy gap $Eg_{37A}$ of the third carrier transportation layer 37A is greater than the energy gap $Eg_{36}$ of the light emission layer 36, recombination in the third carrier transportation layer 37A is prevented, and this increases the efficiency of light emission in the light emission layer 36.

According to the present embodiment, as described above, it is possible to prevent light emission in the second carrier transportation layer 35B which is formed on the side of light emission layer 36 facing the anode 34 and in the third carrier transportation layer 37A which is formed on the side of the light emission layer 36 facing the cathode 39, and at the same time, it is possible to adjust the magnitudes of the hole current and the electron current and increase the light emission efficiency in the light emission layer 36.

FIRST EXAMPLE

The organic EL device according to the first embodiment was fabricated in the following way. On the glass substrate 33, by vacuum evaporation, there were stacked sequentially an ITO electrode as the anode 34, a 2-TNATA layer (film thickness: 30 nm)/a αNPD layer (film thickness: 10 nm), a 2-TNATA layer (film thickness: 10 nm)/a αNPD layer (film thickness: 10 nm), and a 2-TNATA layer (film thickness: 10 nm)/a αNPD layer (film thickness: 30 nm) as the first carrier transportation layer 35A/the second carrier transportation layer 35B, a non-doped TYG-201 layer having a film thickness of 20 nm and emitting green light as the light emission layer 36, a TYE-704 layer (film thickness: 10 nm)/a TYG-201 layer (film thickness: 10 nm), and a TYE-704 layer (film thickness: 10 nm)/a TYG-201 layer (film thickness: 10 nm) as the third carrier transportation layer 37A and the fourth carrier transportation layer 37B, a TYE-704 layer having a thickness of 20 nm as the electron transportation layer 38, and an Al/LiF film, which includes a 0.5 nm thick LiF film and a 100 nm Al film, as the cathode 39.

In the aforesaid first embodiment, only one stacked layer of the first carrier transportation layer 35A and the second carrier transportation layer 35B is formed on the side of light emission layer 36 facing the anode 34, but in the first example of the present embodiment, three stacked layers were formed. In addition, in the aforesaid first embodiment, only one stacked layer of the third carrier transportation layer 37A and the fourth carrier transportation layer 37B is formed on the side of light emission layer 36 facing the cathode 39, but in the first example of the present embodiment, two stacked layers were formed.

Below, methods of measuring the energy gap Eg and the ionization potential Ip are explained, which are important in embodying the present invention.

When measuring the energy gap Eg, each individual thin film of the organic EL device 30, which was formed by the same method as that described above in formation of the organic EL device 30, was irradiated in the air by light from ultraviolet rays to visible light, and a spectrophotometer able to measure an optical absorption spectrum, for example, a spectrophotometer U-4100 produced by Hitachi Co., is used to measure the energy gap Eg.

Figure 5:
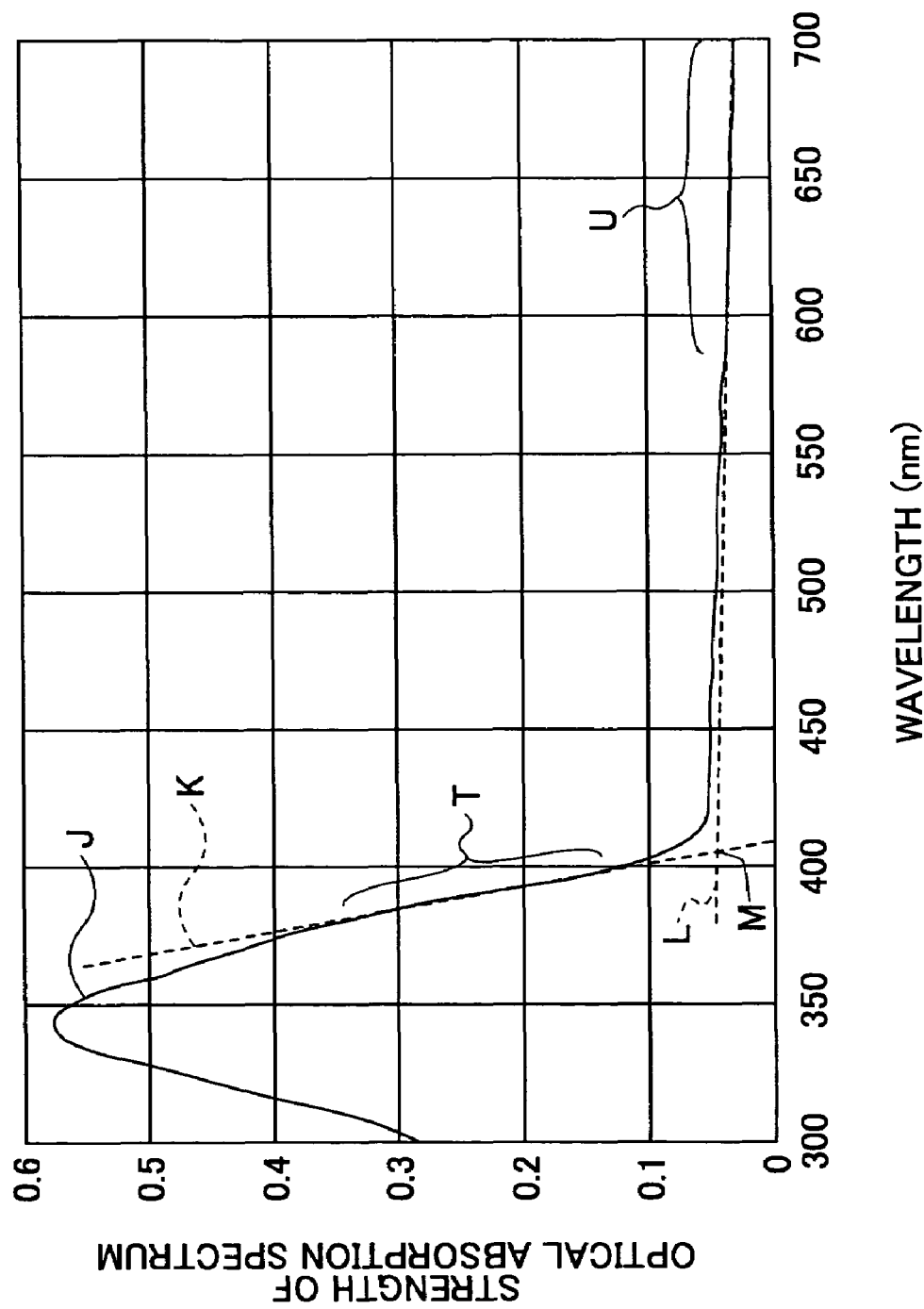
FIG. 5 shows dependence of an optical absorption spectrum on wavelength.

FIG. 5 shows dependence of the optical absorption spectrum on the wavelength. In FIG. 5, a curve J indicates measurement results of the optical absorption spectrum. The region T corresponds to a straight line portion of the curve J when the strength shown in the optical absorption spectrum rises. The region U corresponds to a straight line portion of the curve J in the un-absorbed wavelength region in the optical absorption spectrum. A straight line K is drawn to overlap on the curve J in the region T. A straight line L is drawn to overlap on the curve J in the region U. The energy gap Eg is found from a cross-point of the straight line K and the straight line L.

When measuring the ionization potential Ip, the thin films, which are formed in the same way as those used in the measurement of the energy gap Eg, were irradiated in the air by ultraviolet rays, and an atmospheric ultraviolet photo-electron spectrometer, for example, AC-1 fabricated by RIKEN KEIKI, is used to measure the number of the emitted photo-electrons. The ionization potential Ip is deduced from a relation between the energy of the ultraviolet rays and the root of the number of the emitted photo-electrons. The measurement conditions of the AC-1 fabricated by RIKEN KEIKI are as follows. The energy range of the ultraviolet rays is from 3.8 to 6.2 eV, the strength of the ultraviolet rays is 20 nW, the thickness of the thin films is 50 nm.

Figure 6:
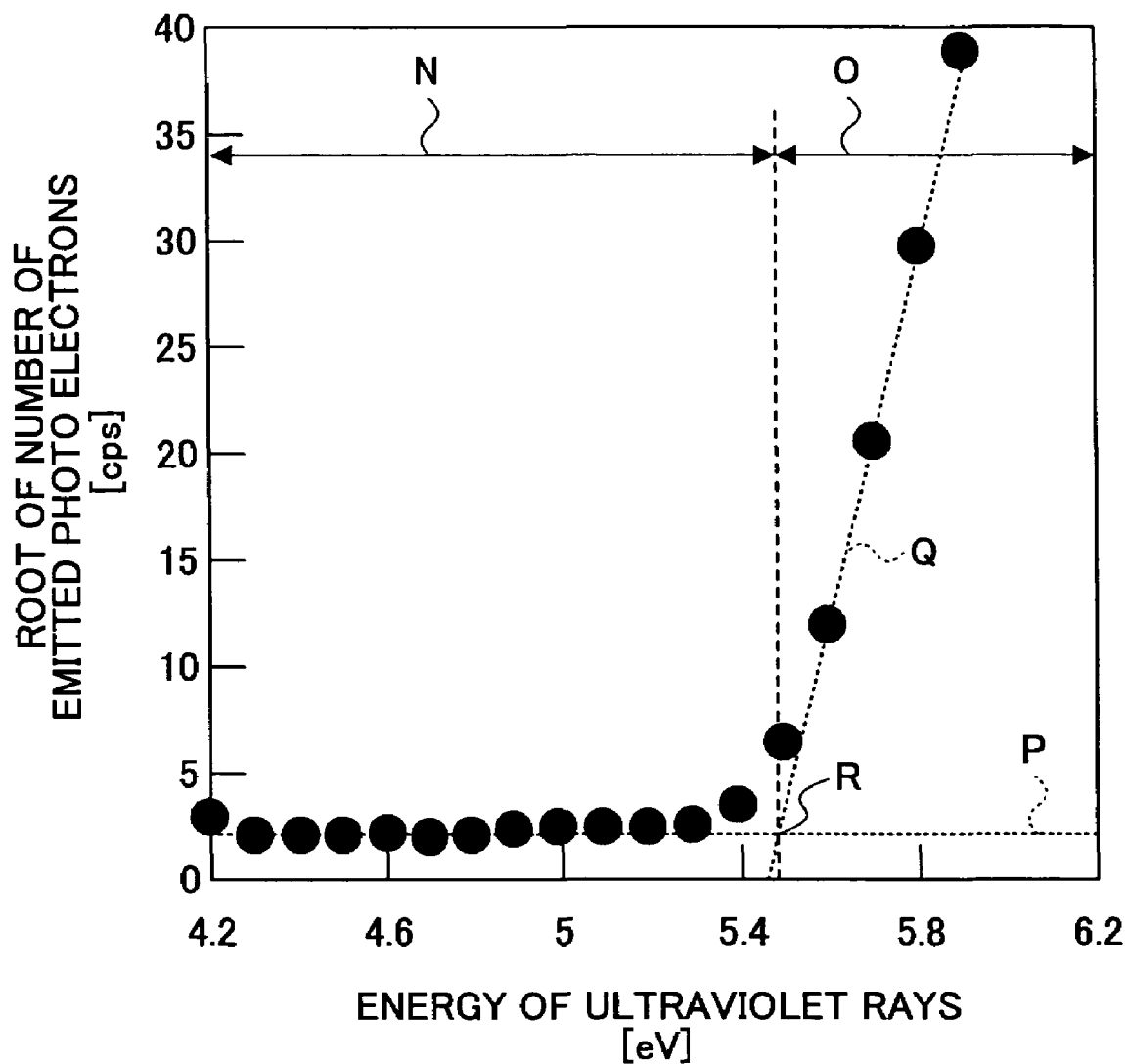
FIG. 6 shows a relation between energy of ultraviolet rays and the root of the number of the emitted photo-electrons.

FIG. 6 shows a relation between the energy of the ultraviolet rays and the root of the number of the emitted photo-electrons. The number of the emitted photo-electrons depends on the energy of the ultraviolet rays. As illustrated in FIG. 6, in a region N, because the energy of the ultraviolet rays is small, no photo-electrons are emitted, but in a region O, since the energy of the ultraviolet rays is sufficiently large, photo-electrons are excited to levels at energies higher than the vacuum levels, and photo-electrons are emitted.

A straight line P in FIG. 6 is obtained by least square approximation in a range of the ultraviolet rays' energy from 4.2 eV to 5.3 eV. A straight line Q is obtained by least square approximation in a range of the ultraviolet rays' energy from 5.6 eV to 5.9 eV.

The cross point R of the straight line P and the straight line Q represents threshold energy of photo electron emission, and this threshold energy of photo electron emission corresponds to the ionization potential Ip.

The electron affinity Ea is calculated from the difference between the ionization potential Ip and the energy gap Eg.

FIG. 7 is a table summarizing the electron affinity Ea, the ionization potential Ip, and the energy gap Eg of the layers shown in the first example of the present embodiment. As illustrated in FIG. 7, the ionization potential Ip of the 2-TNATA layer as the first carrier transportation layer 35A is 5.19 eV, and the ionization potential Ip of the αNPD layer as the second carrier transportation layer 35B is 5.46 eV.

Therefore, due to the difference between the ionization potentials of the 2-TNATA layer and the αNPD layer, three energy barriers each having a height of 0.27 eV are formed on the interface of the first carrier transportation layer 35A and the second carrier transportation layer 35B.

The electron affinity Ea of the TYG-201 layer as the fourth carrier transportation layer 37B is 3.20 eV, and the electron affinity Ea of the TYE-704 layer as the third carrier transportation layer 37A is 2.97 eV.

Therefore, due to the difference between the electron affinities of the TYG-201 layer and the TYE-704 layer, two energy barriers each having a height of 0.23 eV are formed on the interface of the fourth carrier transportation layer 37B and the third carrier transportation layer 37A.

Consequently, because of the three energy barriers formed on the interface of the first carrier transportation layer 35A and the second carrier transportation layer 35B, the holes are stored in the 2-TNATA layers as the first carrier transportation layer 35A, and the magnitude of the hole current decreases. In addition, because of the two energy barriers formed on the interface of the fourth carrier transportation layer 37B and the third carrier transportation layer 37A, electrons are stored in the TYG-201 layers as the fourth carrier transportation layer 37B, and the magnitude of the electron current decreases. As a result, the magnitudes of the hole current and electron current flowing through the light emission layer 36 are adjusted, and the electrons and the holes are re-combined after the adjustment. This increases the efficiency of light emission.

The energy gap Eg of the αNPD layer as the second carrier transportation layer 35B is 3.04 eV, and The energy gap Eg of the TYE-704 as the third carrier transportation layer 37A is 2.76 eV, and the energy gap Eg of the light emission layer 36 is 2.40 eV. Hence, because the energy gap Eg of the second carrier transportation layer 35B is greater than the energy gap Eg of the light emission layer 36 by 0.64 eV, and the energy gap Eg of the third carrier transportation layer 37A is greater than the energy gap Eg of the light emission layer 36 by 0.36 eV, the probability of electron-hole re-combination increases, and this increases the light emission efficiency of the TYG-201 layer used for the light emission layer 36.

SECOND EXAMPLE

FIG. 8 is a table for explaining the layer structure of an organic EL device as the second example of the present embodiment.

In the second example of the present embodiment, the number of the stacked structures of the first carrier transportation layer 35A and the second carrier transportation layer 35B between the light emission layer 36 and the anode 34 is reduced by one compared with that in the first example of the present embodiment. Thickness of each layer can be appropriately determined according to the total thickness of the organic EL device.

According to the second example of the present embodiment, the number of the stacked structures of the first carrier transportation layer 35A and the second carrier transportation layer 35B is less than that in the first example by one. As described above, the magnitudes of the hole current and the electron current depend on types of the films constituting the organic EL device and film thicknesses of the stacked films. When the magnitude of the hole current is not sufficiently large compared with the electron current, if three energy barriers are formed as in the first example of the present embodiment, the hole current is too small and the light emission efficiency declines. Therefore, by reducing the number of the energy barriers against the holes by one, reduction of the hole current is suppressed more effectively than in the first example of the present embodiment. Thereby, more electrons and holes are re-combined, and this increases the light emission efficiency of the whole organic EL device.

Evaluation of Light Emission Efficiency

Below, evaluations were made of the light emission efficiency of the organic EL devices in the first example and the second example of the present embodiment. In addition, three organic EL devices, to which the present invention is not applied, were also fabricated and evaluated as examples for the purpose of comparison.

The organic EL device as the first example for comparison was fabricated in the following way. On a glass substrate, by vacuum evaporation, there were stacked sequentially an ITO electrode as an anode, a 30 nm thick 2-TNATA layer as a hole injection layer, a 50 nm thick a NPD layer as a hole transportation layer, a non-doped TYG-201 layer having a film thickness of 50 nm and emitting green light as the light emission layer, a TYE-704 layer having a film thickness of 40 nm as an electron transportation layer, and an Al/LiF stacked film including a 0.5 nm thick LiF film and a 100 nm Al film as a cathode. The pressure inside the vacuum evaporation apparatus was $1.33 \times 10^{-4}$ Pa, and the temperature of the glass substrate was room temperature.

The organic EL devices as the second and third examples for comparison were fabricated in the same way as the above first example of the organic EL device for comparison.

FIG. 9 is a table for explaining the layer structure of the organic EL devices as the second and third examples for comparison.

Next, voltages were applied on the organic EL devices in the first and second examples of the present embodiment, and measurements were made of the current from the anode to the second carrier transportation layer in contact with the side of light emission layer facing the anode, and the current from the cathode to the third carrier transportation layer in contact with the side of light emission layer facing the cathode, respectively.

In addition, voltages were also applied on the organic EL device as the first example for comparison, and measurements were made of the current from the anode to the hole transportation layer, and the current from the cathode to the electron transportation layer, respectively.

Because the current from the anode to the second carrier transportation layer in contact with the side of light emission layer facing the anode in the first example and the second example of the present embodiment, and the current from the anode to the hole transportation layer in the first example for comparison can be explained as currents generated due to movement of the holes from the anode toward the cathode, here, these currents are defined as the hole current.

Because the current from the cathode to the third carrier transportation layer in contact with the side of light emission layer facing the cathode in the first example and the second example of the present embodiment, and the current from the cathode to the electron transportation layer in the first example for comparison can be explained as currents generated due to movement of the electrons from the cathode toward the anode, here, these currents are defined as the electron current.

Figure 10:
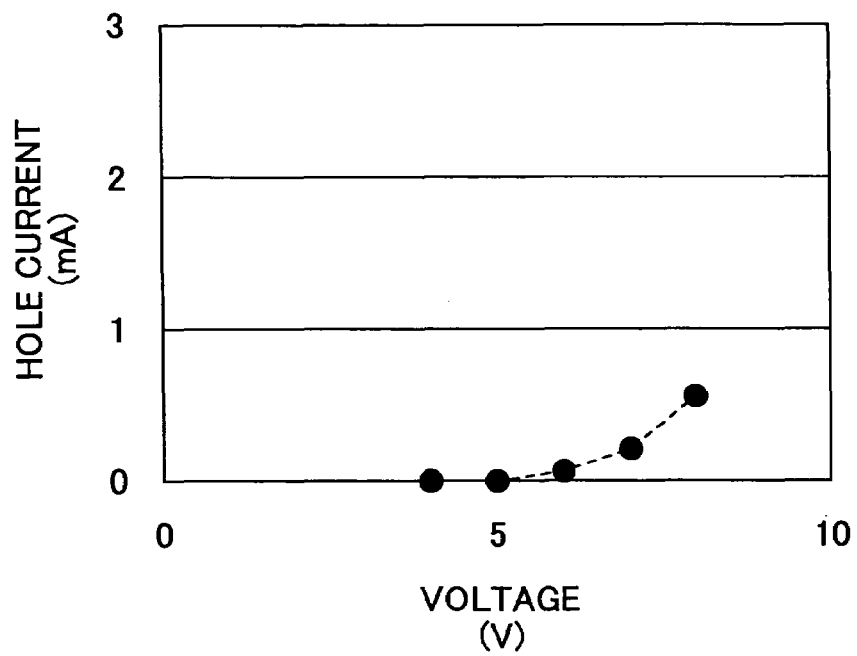
FIG. 10 shows a relation between a hole current and a voltage of the organic EL device as the first example of the present embodiment.

FIG. 10 shows a relation between the hole current and the voltage of the organic EL device as the first example of the present embodiment.

Figure 11:
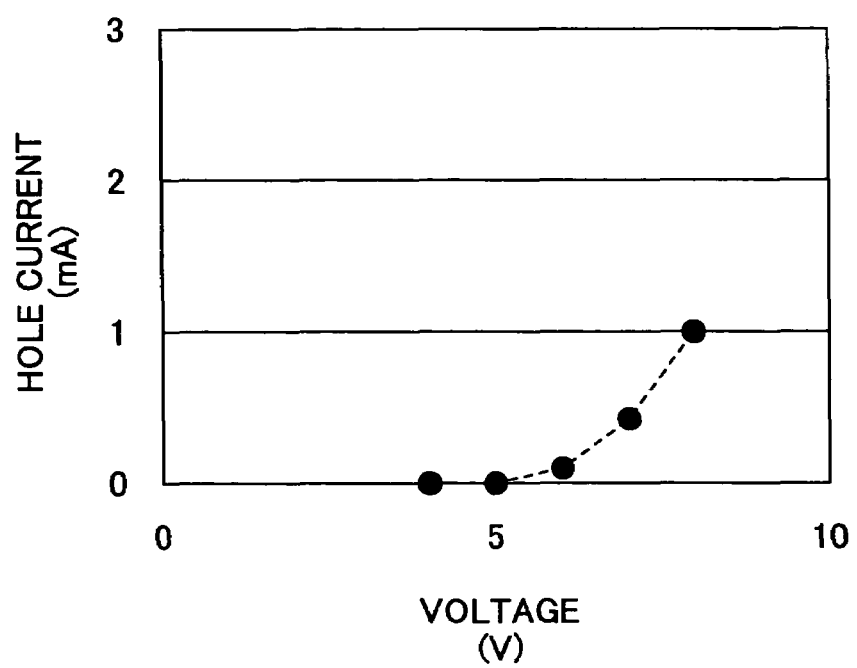
FIG. 11 shows a relation between the hole current and the voltage of the organic EL device as the second example of the present embodiment.

FIG. 11 shows a relation between the hole current and the voltage of the organic EL device as the second example of the present embodiment.

Figure 12:
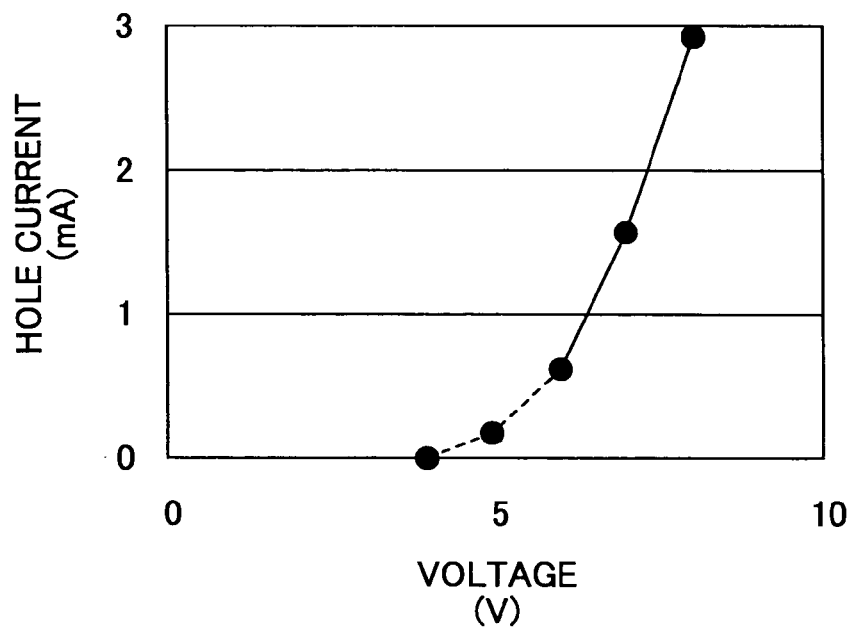
FIG. 12 shows a relation between the hole current and the voltage of the organic EL device as the first example for comparison.

FIG. 12 shows a relation between the hole current and the voltage of the organic EL device as the first example for comparison.

In the organic EL device as the first example of the present embodiment, as illustrated in FIG. 10, three energy barriers are formed on the anode side of the light emission layer, and in the organic EL device as the second example of the present embodiment, as illustrated in FIG. 11, two energy barriers are formed on the anode side of the light emission layer. As illustrated in FIG. 12, one energy barrier is formed in the organic EL device as the first example for comparison. From FIG. 10 through FIG. 12, it is clear that the hole current decreases along with more energy barriers being formed on the anode side of the light emission layer.

Figure 13:
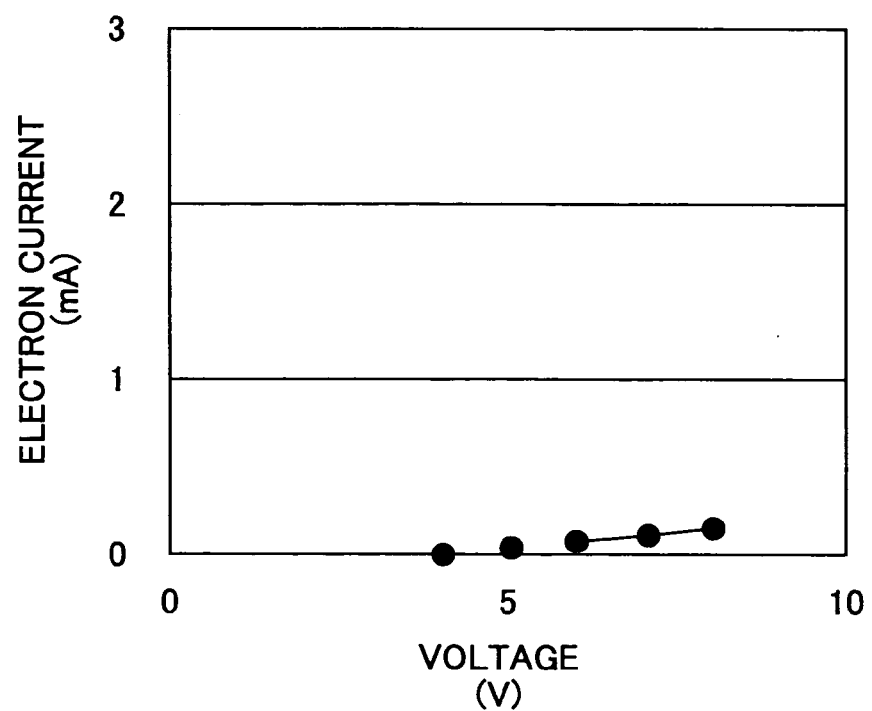
FIG. 13 shows a relation between the electron current and the voltage of the organic EL device as the first example of the present embodiment.

FIG. 13 shows a relation between the electron current and the voltage of the organic EL device as the first example of the present embodiment.

In the organic EL device illustrated in FIG. 13, two energy barriers are formed on the cathode side of the light emission layer. If comparing the electron current in FIG. 13 with the hole current when two energy barriers are formed on the anode side of the light emission layer as illustrated in FIG. 11, it is found that the hole current is greater than the electron current. This fact reveals that the hole current is greater than the electron current when energy barriers are not formed.

Figure 14:
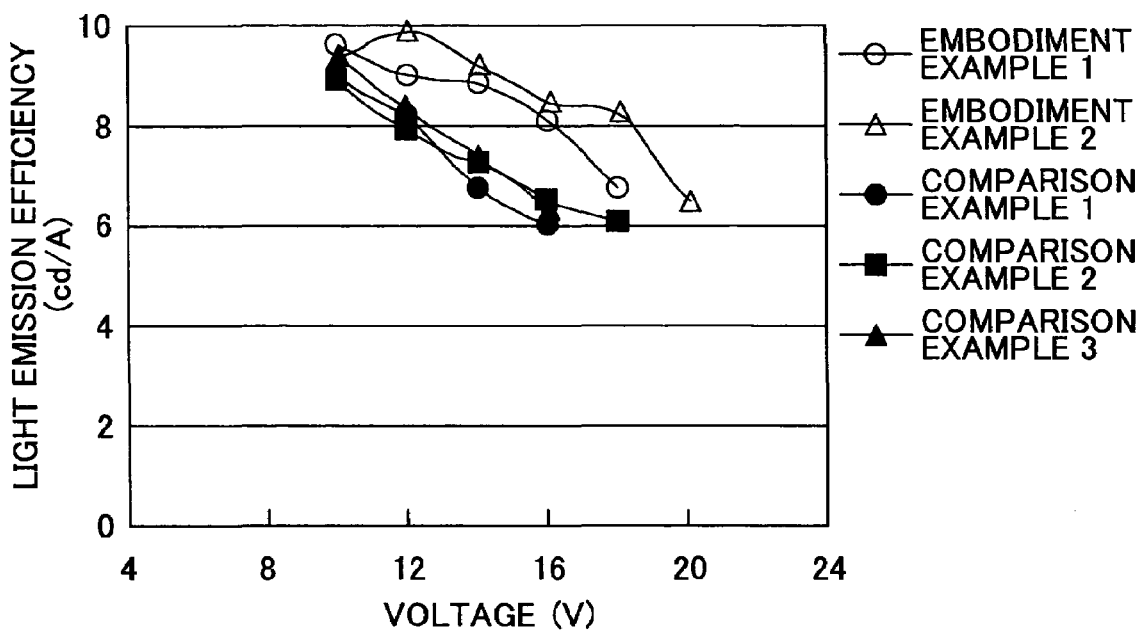
FIG. 14 shows the dependence of the light emission efficiency of the organic EL device on the voltage.

FIG. 14 shows the dependence of the light emission efficiency of the organic EL device on the voltage. As illustrated in FIG. 14, the light emission efficiency of the organic EL device as the second example of the present embodiment has the highest light emission efficiency.

Below, it is investigated why the light emission efficiency of the organic EL device in the second example of the present embodiment is higher than the light emission efficiency of the organic EL device in the first example of the present embodiment, in which more energy barriers against holes are formed. In order to increase the light emission efficiency of the organic EL device, it is required to reduce the magnitude of the current of holes and reduce the difference between the numbers of electrons and holes which contribute to recombination in the light emission layer 36. The magnitude of the electron current is determined by the number and mobility of the electrons, and the magnitude of the hole current is determined by the number and mobility of the holes. Further, since generally the mobility of electrons is less than the mobility of holes, even if the number of electrons is the same as the number of holes, the magnitude of the electron current does not equal the magnitude of the hole current. If energy barriers are not formed, the magnitude of the hole current is greater than the magnitude of the electron current, whereas if energy barriers against holes are present, the magnitude of the hole current decreases, and the number of holes also decreases.

In the first example of the present embodiment, since three energy barriers against holes are formed, perhaps, the number of holes that recombine with electrons is unduly reduced. In contrast, in the second example of the present embodiment, since two energy barriers against holes are formed, which is less than that in the first example, it is considered that the difference between the number of holes and the number of electrons is reduced, and the light emission efficiency of the organic EL device is increased, resulting in better results than in the first example of the present embodiment.

Second Embodiment

Figure 15:
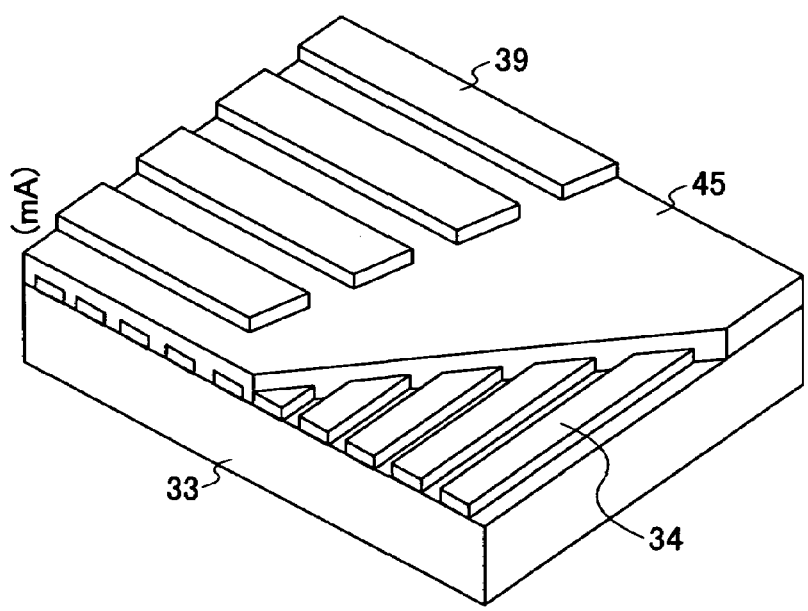
FIG. 15 is a perspective view showing a schematic configuration of an organic electroluminescent display according to a second embodiment of the present invention.

FIG. 15 is a perspective view showing a schematic configuration of an organic electroluminescent display (abbreviated to be "organic EL display" below) according to a second embodiment of the present invention. As illustrated in FIG. 15, in an organic EL display 50, Al/LiF electrodes as the cathode 39, and ITO electrodes as the anode 34 are formed on a glass substrate 33 so as to intersect with each other at right angles, and between the cathode 39 and the anode 34, there is provided a stacked structure 45 forming the organic EL device of the first embodiment. The organic EL display 50 emits light by applying specified voltages on the ITO electrodes and the Al/LiF electrodes corresponding to regions of the light emission layer to be flashed. Due to such a configuration of the organic EL display 50, the light emission efficiency can be improved.

While the invention has been described with reference to preferred embodiments, the invention is not limited to these embodiments, but numerous modifications could be made thereto without departing from the basic concept and scope described in the claims.

For example, the numbers of the energy barriers against holes and the energy barriers against electrons shown in the first example of the first embodiment may be appropriately selected for individual organic EL device.

INDUSTRY APPLICABILITY

According to the present invention, by providing a first carrier transportation layer on a side of the light emission layer facing the anode, and a second carrier transportation layer, which has an ionization potential $Ip_{P2}$ less than an ionization potential $Ip_{P1}$ of the first carrier transportation layer, on a side of the first carrier transportation layer facing the cathode, an energy barrier is built on the interface of the first carrier transportation layer and the second carrier transportation layer, which are in the middle of the path of holes moving from the anode toward the light emission layer. Thus, the holes are stored in the first carrier transportation layer, and the magnitude of the hole current flowing through the light emission layer decreases. As a result, the magnitude of the current of the holes is adjusted, and this increases the light emission efficiency.

The invention claimed is:

1. An organic electroluminescent device, comprising:
   a light emission layer formed between an anode and a cathode that face each other;
   a first carrier transportation layer formed on a side of the light emission layer facing the anode;
   a second carrier transportation layer formed on a side of the first carrier transportation layer facing the cathode and in contact with the first carrier transportation layer; and
   two or more stacks of layers formed alternately comprising the first carrier transportation layer and the second carrier transportation layer,
   wherein an ionization potential $IP_{P1}$ of the first carrier transportation layer and an ionization potential $IP_{P2}$ of the second carrier transportation layer satisfy $$IP_{P1} < IP_{P2}.$$

2. The organic electroluminescent device as claimed in the claim 1, wherein the first carrier transportation layer uses a NPD, and the second carrier transportation layer uses 2-TNATA.

3. The organic electroluminescent device as claimed in the claim 1, wherein an energy gap $Eg_{EML}$ of the light emission layer and an energy gap $Eg_{P2}$ of the second carrier transportation layer satisfy $$Eg_{EML} < Eg_{P2}.$$

4. An organic electroluminescent device, comprising:
   a light emission layer formed between an anode and a cathode that face each other;
   a first carrier transportation layer formed on a side of the light emission layer facing the cathode;
   a second carrier transportation layer formed to be in contact with a side of the first carrier transportation layer facing the cathode; and
   two or more stacks of layers formed alternately comprising the first carrier transportation layer and the second carrier transportation layer,
   wherein an electron affinity $Ea_{P1}$ of the first carrier transportation layer and an electron affinity $Ea_{P2}$ of the second carrier transportation layer satisfy $$Ea_{P1} < Ea_{P2}.$$

5. The organic electro luminescence device as claimed in the claim 4, wherein an energy gap $Eg_{EML}$ of the light emission layer and an energy gap $Eg_{P1}$ of the first carrier transportation layer satisfy $Eg_{EML} < Eg_{P1}$.

6. An organic electroluminescent device, comprising:
a light emission layer formed between an anode and a cathode that face each other;
a first carrier transportation layer formed on a side of the light emission layer facing the anode;
a second carrier transportation layer formed on a side of the first carrier transportation layer facing the cathode and in contact with the first carrier transportation layer;
two or more stacks of layers formed alternately comprising the first carrier transportation layer and the second carrier transportation layer;
a third carrier transportation layer formed on a side of the light emission layer facing the cathode;
a fourth carrier transportation layer formed on a side of the third carrier transportation layer facing the cathode and in contact with the third carrier transportation layer; and
two or more stacks of layers formed alternately comprising the third carrier transportation layer and the fourth carrier transportation layer,
wherein an ionization potential $IP_{P1}$ of the first carrier transportation layer and an ionization potential $IP_{P2}$ of the second carrier transportation layer satisfy $IP_{P1} < IP_{P2}$, and an electron affinity $Ea_{P3}$ of the third carrier transportation layer and an electron affinity $Ea_{P4}$ of the fourth carrier transportation layer satisfy $Ea_{P3} < Ea_{P4}$.

7. The organic electro luminescence device as claimed in the claim 6, wherein an energy gap $Eg_{EML}$ of the light emission layer, an energy gap $Eg_{P2}$ of the second carrier transportation layer, and an energy gap $Eg_{P3}$ of the third carrier transportation layer satisfy $Eg_{EML} < Eg_{P2}$, and $Eg_{EML} < Eg_{P3}$.

8. An organic electroluminescent display comprising an organic electroluminescent device, said organic electroluminescent device including:
a light emission layer formed between an anode and a cathode that face each other;
a first carrier transportation layer formed on a side of the light emission layer facing the anode;
a second carrier transportation layer formed on a side of the first carrier transportation layer facing the cathode and in contact with the first carrier transportation layer; and
two or more stacks of layers formed alternately comprising the first carrier transportation layer and the second carrier transportation layer,
wherein an ionization potential $IP_{P1}$ of the first carrier transportation layer and an ionization potential $IP_{P2}$ of the second carrier transportation layer satisfy $IP_{P1} < IP_{P2}$.

9. An organic electroluminescent display comprising an organic electroluminescent device, said organic electroluminescent device including:
a light emission layer formed between an anode and a cathode that face each other;
a first carrier transportation layer formed on a side of the light emission layer facing the cathode; and
a second carrier transportation layer formed to be in contact with a side of the first carrier transportation layer facing the cathode;
two or more stacks of layers formed alternately comprising the first carrier transportation layer and the second carrier transportation layer,
wherein an electron affinity $Ea_{P1}$ of the first carrier transportation layer and an electron affinity $Ea_{P2}$ of the second carrier transportation layer satisfy $Ea_{P1} < Ea_{P2}$.

10. An organic electroluminescent display comprising an organic electroluminescent device, said organic electroluminescent device including:
a light emission layer formed between an anode and a cathode that face each other;
a first carrier transportation layer formed on a side of the light emission layer facing the anode;
a second carrier transportation layer formed on a side of the first carrier transportation layer facing the cathode and in contact with the first carrier transportation layer;
two or more stacks of layers formed alternately comprising the first carrier transportation layer and the second carrier transportation layer;
a third carrier transportation layer formed on a side of the light emission layer facing the cathode;
a fourth carrier transportation layer formed on a side of the third carrier transportation layer facing the cathode and in contact with the third carrier transportation layer; and
two or more stacks of layers formed alternately comprising the third carrier transportation layer and the fourth carrier transportation layer,
wherein an ionization potential $IP_{P1}$ of the first carrier transportation layer and an ionization potential $IP_{P2}$ of the second carrier transportation layer satisfy $IP_{P1} < IP_{P2}$, and an electron affinity $Ea_{P3}$ of the third carrier transportation layer and an electron affinity $Ea_{P4}$ of the fourth carrier transportation layer satisfy $Ea_{P3} < Ea_{P4}$.

* * * * *